(12) United States Patent
Onohara et al.

(10) Patent No.: US 11,346,651 B2
(45) Date of Patent: May 31, 2022

(54) OPTICAL DISTANCE MEASUREMENT DEVICE AND PROCESSING DEVICE

(71) Applicant: Mitsubishi Electric Corporation, Tokyo (JP)

(72) Inventors: Kiyoshi Onohara, Tokyo (JP); Hiroki Goto, Tokyo (JP); Naoki Suzuki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/038,791

(22) Filed: Sep. 30, 2020

(65) Prior Publication Data

US 2021/0010802 A1 Jan. 14, 2021

Related U.S. Application Data

(63) Continuation of application No. PCT/JP2018/020013, filed on May 24, 2018.

(51) Int. Cl.
*G01B 11/02* (2006.01)
*G01B 9/02004* (2022.01)

(52) U.S. Cl.
CPC ........ *G01B 11/026* (2013.01); *G01B 9/02004* (2013.01)

(58) Field of Classification Search
CPC .... G01B 11/026; G01B 9/02; G01B 9/02004; G01B 9/02007
See application file for complete search history.

(56) References Cited

U.S. PATENT DOCUMENTS

| 5,784,161 A * | 7/1998 | Bechstein ................. G01J 9/04 356/487 |
| 2006/0279723 A1 | 12/2006 | Halmos et al. |
| 2012/0106579 A1 | 5/2012 | Roos et al. |
| 2014/0268050 A1* | 9/2014 | Jayaraman ............ H01S 5/4087 356/479 |
| 2015/0019160 A1* | 1/2015 | Thurner ............. G01B 9/02007 702/150 |

(Continued)

FOREIGN PATENT DOCUMENTS

| EP | 1 889 091 B1 | 12/2011 |
| EP | 3 081 956 A1 | 10/2016 |

(Continued)

OTHER PUBLICATIONS

German Office Action for German Application No. 11 2018 007 502.8, dated Jun. 11, 2021, with English translation.

(Continued)

*Primary Examiner* — Tarifur R Chowdhury
*Assistant Examiner* — Jonathon Cook
(74) *Attorney, Agent, or Firm* — Birch, Stewart, Kolasch & Birch, LLP (57) ABSTRACT

The optical distance measurement device is configured in such a manner that the frequency-swept light output unit outputs frequency-swept light during a time period from when frequency sweeping of frequency-swept light being output is completed to when the next frequency sweeping becomes possible, the frequency-swept light output during the time period being frequency swept at a different frequency from the frequency-swept light being output.

4 Claims, 7 Drawing Sheets

(56) References Cited

U.S. PATENT DOCUMENTS

| | | | |
|---|---|---|---|
| 2016/0123720 A1* | 5/2016 | Thorpe | ............ G01B 9/02004 356/498 |
| 2016/0291137 A1 | 10/2016 | Sakimura et al. | |
| 2017/0146335 A1 | 5/2017 | Martinez et al. | |
| 2017/0343333 A1* | 11/2017 | Thorpe | ............ H04B 10/5165 |
| 2018/0024246 A1 | 1/2018 | Jeong et al. | |

FOREIGN PATENT DOCUMENTS

| | | |
|---|---|---|
| JP | 8-5733 A | 1/1996 |
| JP | 2016-3870 A | 1/2016 |
| JP | 2017-75786 A | 4/2017 |
| JP | 2017-523403 A | 8/2017 |
| JP | 2017-161484 A | 9/2017 |
| JP | 2017-191815 A | 10/2017 |

OTHER PUBLICATIONS

Office Action dated Dec. 2, 2021 issued in corresponding Indian Patent Application No. 202047042670.

* cited by examiner

OPTICAL DISTANCE MEASUREMENT DEVICE AND PROCESSING DEVICE

CROSS REFERENCE TO RELATED APPLICATIONS

This application is a Continuation of PCT International Application No. PCT/JP2018/020013, filed on May 24, 2018, which is hereby expressly incorporated by reference into the present application.

TECHNICAL FIELD

The present invention relates to an optical distance measurement device that calculates a distance to a measurement target, and a processing device provided with the optical distance measurement device.

BACKGROUND ART

As one of methods for measuring a distance to a measurement target by using light, there is a frequency scanning interferometry.

An optical distance measurement device that uses the frequency scanning interferometry irradiates the measurement target with frequency-swept light, the frequency of which changes with time, and receives the frequency-swept light reflected by the measurement target as reflected light.

The optical distance measurement device uses, as reference light, a part of frequency-swept light obtained before the measurement target is irradiated therewith, and measures a distance to the measurement target on the basis of interference light between the reference light and the reflected light.

The following patent literature 1 discloses a frequency-swept signal source that generates a frequency electric signal, the frequency of which changes in a triangular or sawtooth waveform with time.

A frequency electric signal having a sawtooth waveform is a signal, the frequency of which changes from the lowest frequency $f_{min}$ to the highest frequency $f_{max}$ with time.

When a frequency of the frequency electric signal having a sawtooth waveform reaches the highest frequency $f_{max}$, the frequency temporarily returns to the lowest frequency $f_{min}$, and then changes from the lowest frequency $f_{min}$ to the highest frequency $f_{max}$ again.

CITATION LIST

Patent Literatures

Patent Literature 1: Japanese Patent Application Laid-Open No. 2017-191815

SUMMARY OF INVENTION

Technical Problem

If the optical distance measurement device that uses the frequency scanning interferometry can use the frequency-swept signal source disclosed in the patent literature 1, a laser light source is capable of repeatedly emitting frequency-swept light on the basis of a voltage or a current of an electric signal generated by the frequency-swept signal source.

However, in such a case where a voltage or a current of an electric signal generated by the frequency-swept signal source sharply changes from a maximum value to a minimum value, frequency-swept light output from the laser light source cannot follow the response speed of the electric signal. Therefore, in a case where an electric signal is output in such a manner that an electric signal generated by the frequency-swept signal source returns to the lowest frequency $f_{min}$ of frequency-swept light, and then the frequency-swept light immediately changes, frequency sweeping of frequency-swept light may be restarted before an oscillating frequency returns to the lowest frequency $f_{min}$.

In order to configure frequency sweeping of frequency-swept light to be restarted after the frequency of the frequency-swept light completely returns to the lowest frequency $f_{min}$, the frequency-swept signal source is required to output an electric signal in such a manner that after the frequency of the frequency-swept light returns to the lowest frequency $f_{min}$, the frequency of the frequency-swept light changes after a lapse of a fixed time period.

The laser light source outputs frequency-swept light in which a change in sweep frequency over time is directly proportional to a change in voltage or current of the electric signal, and therefore with respect to the frequency-swept light as well, there is a case where after the frequency of the frequency-swept light returns to the lowest frequency $f_{min}$, a fixed time period is required before frequency sweeping is restarted.

The frequency of the frequency-swept light does not change during a time period after the frequency of the frequency-swept light returns to the lowest frequency $f_{min}$ and before the next frequency sweeping is restarted, and therefore there arises a problem that the optical distance measurement device is not capable of measuring a distance to a measurement target.

The present invention has been made to solve the problem such as that described above, and an object of the present invention is to obtain an optical distance measurement device that is capable of eliminating a time period during which a distance to a measurement target cannot be measured, and a processing device.

Solution to Problem

An optical distance measurement device according to the present invention includes: processing circuitry to repeatedly output frequency-swept light, the frequency of which changes with time; to output, as reference light, frequency-swept light, and to irradiate a measurement target with the frequency-swept light to receive, as reflected light, frequency-swept light reflected by the measurement target; to cause the reflected light and the reference light to interfere with each other, and to output interference light between the reflected light and the reference light; and to calculate a difference between a frequency of the reflected light and a frequency of the reference light on the basis of the interference light, and to calculate, from the difference, a distance to the measurement target, wherein the processing circuitry outputs frequency-swept light during a time period from when frequency sweeping of frequency-swept light being output is completed to when the next frequency sweeping becomes possible, the frequency-swept light output during the time period being frequency swept at a different frequency from the frequency-swept light being output.

Advantageous Effects of Invention

According to the present invention, the optical distance measurement device is configured in such a manner that the processing circuitry outputs frequency-swept light during a time period from when frequency sweeping of frequency-swept light being output is completed to when the next frequency sweeping becomes possible, the frequency-swept light output during the time period being frequency swept at a different frequency from the frequency-swept light being output. Therefore, the optical distance measurement device according to the present invention is capable of eliminating a time period during which a distance to a measurement target cannot be measured.

BRIEF DESCRIPTION OF DRAWINGS

FIG. 5 is a hardware configuration diagram of a computer used in a case where the distance calculation unit 34 is implemented by software, firmware or the like.

DESCRIPTION OF EMBODIMENTS

In order to describe the present invention in further detail, embodiments for carrying out the present invention will be described below with reference to the accompanying drawings.

First Embodiment

Figure 1:
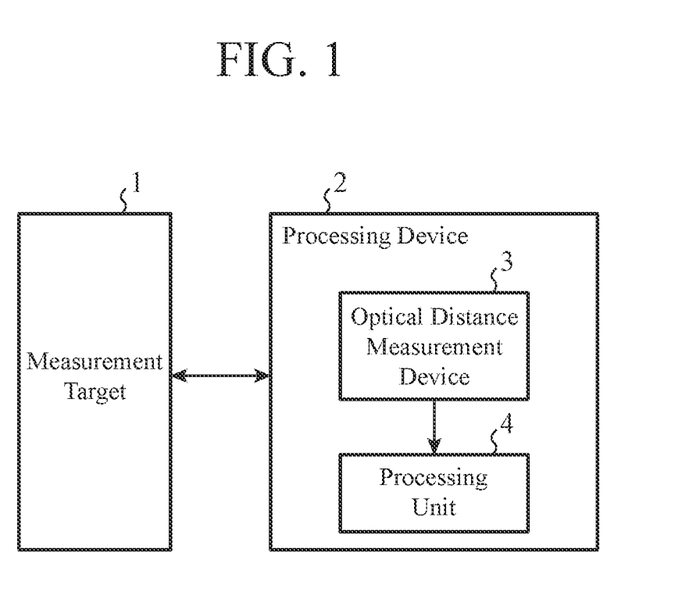
FIG. 1 is a configuration diagram illustrating a processing device 2 according to a first embodiment.

FIG. 1 is a configuration diagram illustrating a processing device 2 according to a first embodiment.

In FIG. 1, a measurement target 1 corresponds to a substrate or the like to be processed by the processing device 2.

The measurement target 1 is an object, the distance to which is to be measured by an optical distance measurement device 3, and is an object that is to be processed by a processing unit 4.

The processing device 2 is provided with the optical distance measurement device 3 and the processing unit 4.

The optical distance measurement device 3 is a device that measures a distance to the measurement target 1, and outputs the measured distance to the processing unit 4.

The processing unit 4 processes the measurement target 1 on the basis of the distance output from the optical distance measurement device 3.

One possible processing example of the processing unit 4 includes processing of polishing the measurement target 1, or processing of cutting the measurement target 1, in such a manner that the distance output from the optical distance measurement device 3 agrees with a designed value.

Figure 2:
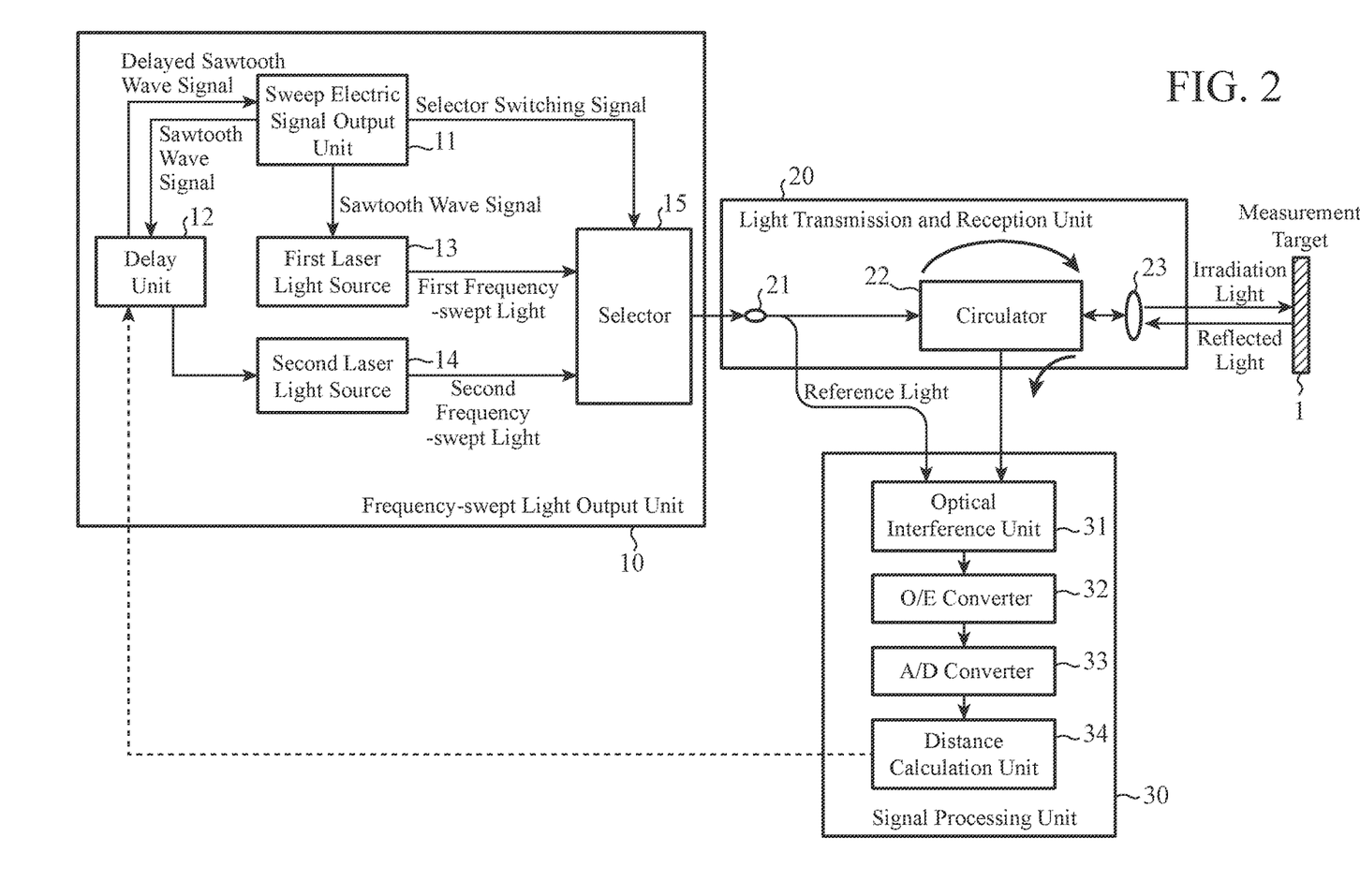
FIG. 2 is a configuration diagram illustrating an optical distance measurement device 3 according to the first embodiment.

FIG. 2 is a configuration diagram illustrating the optical distance measurement device 3 according to the first embodiment.

In FIG. 2, a frequency-swept light output unit 10 is provided with a sweep electric signal output unit 11, a delay unit 12, a first laser light source 13, a second laser light source 14, and a selector 15.

The frequency-swept light output unit 10 repeatedly outputs frequency-swept light to a light transmission and reception unit 20, the frequency-swept light changing in frequency with time.

The frequency-swept light output unit 10 outputs frequency-swept light to the light transmission and reception unit 20 during a time period from when frequency sweeping of frequency-swept light being output is completed to when the next frequency sweeping becomes possible, the frequency-swept light output during the time period being frequency swept at a different frequency from the frequency-swept light being output.

The sweep electric signal output unit 11 outputs a sweep electric signal to the delay unit 12 and the first laser light source 13, the sweep electric signal causing a frequency of the first laser light source 13 and a frequency of the second laser light source 14 to change with time.

It can be considered that the sweep electric signal output from the sweep electric signal output unit 11 includes not only a sawtooth wave signal but also a triangular wave signal. With respect to the optical distance measurement device 3 of the first embodiment, it is assumed that the sweep electric signal output unit 11 outputs a sawtooth wave signal as the sweep electric signal.

The sawtooth wave signal is a signal in which a voltage or a current changes in such a manner that the frequency of the first laser light source 13 and the frequency of the second laser light source 14 change from the lowest frequency $f_{min}$ to the highest frequency $f_{max}$ with time.

When a frequency of the frequency-swept light reaches the highest frequency $f_{max}$, the frequency temporarily returns to the lowest frequency $f_{min}$, and then changes from the lowest frequency $f_{min}$ to the highest frequency $f_{max}$ again.

In addition, the sweep electric signal output unit 11 outputs a first selector switching signal indicating that the first frequency-swept light is selected, or a second selector switching signal indicating that the second frequency-swept light is selected, to the selector 15.

The delay unit 12 delays the sawtooth wave signal output from the sweep electric signal output unit 11, and then outputs the delayed sawtooth wave signal to the second laser light source 14 and the sweep electric signal output unit 11.

The first laser light source 13 is connected to the selector 15 via an optical fiber.

The first laser light source 13 repeatedly outputs the first frequency-swept light, the frequency of which changes with time, to the selector 15 on the basis of the sawtooth wave signal output from the sweep electric signal output unit 11.

The second laser light source 14 is connected to the selector 15 via an optical fiber.

The second laser light source 14 repeatedly outputs the second frequency-swept light, the frequency of which changes with time, to the selector 15 on the basis of the sawtooth wave signal output from the delay unit 12.

The selector 15 is connected to an optical coupler 21 of the light transmission and reception unit 20 via an optical fiber.

When the selector 15 receives the first selector switching signal from the sweep electric signal output unit 11, the selector 15 selects the first frequency-swept light from between the first frequency-swept light and the second frequency-swept light, and then outputs the first frequency-swept light to the optical coupler 21.

When the selector 15 receives the second selector switching signal from the sweep electric signal output unit 11, the selector 15 selects the second frequency-swept light from between the first frequency-swept light and the second frequency-swept light, and then outputs the second frequency-swept light to the optical coupler 21.

The light transmission and reception unit 20 is provided with the optical coupler 21, a circulator 22, and a collimator lens 23.

The light transmission and reception unit 20 outputs the frequency-swept light (the first frequency-swept light or the second frequency-swept light), which has been output from the frequency-swept light output unit 10, to a signal processing unit 30 as reference light.

In addition, the light transmission and reception unit 20 irradiates the measurement target 1 with the frequency-swept light output from the frequency-swept light output unit 10 as irradiation light, and receives the irradiation light reflected by the measurement target 1 as reflected light.

The optical coupler 21 is connected to the circulator 22 via an optical fiber, and is connected to the optical interference unit 31 of the signal processing unit 30 via an optical fiber.

The optical coupler 21 causes the frequency-swept light output from the frequency-swept light output unit 10 to branch into two frequency-swept light beams, and outputs one frequency-swept light beam after branching to the circulator 22, and outputs the other frequency-swept light beam after branching to the optical interference unit 31 as reference light.

The circulator 22 is connected to the collimator lens 23 via an optical fiber, and is connected to the optical interference unit 31 via an optical fiber.

The circulator 22 outputs the frequency-swept light output from the optical coupler 21 to the collimator lens 23, and outputs the reflected light output from the collimator lens 23 to the optical interference unit 31.

The collimator lens 23 adjusts a beam diameter of frequency-swept light in such a manner that the frequency-swept light output from the circulator 22 becomes parallel light. The frequency-swept light, the beam diameter of which has been adjusted by the collimator lens 23, is emitted to space toward the measurement target 1 as irradiation light.

The collimator lens 23 concentrates, as reflected light, the irradiation light reflected by the measurement target 1, and outputs the reflected light to the circulator 22.

The signal processing unit 30 is provided with the optical interference unit 31, an opto-electric converter (hereinafter referred to as "O/E converter") 32, an analog-digital converter (hereinafter referred to as "A/D converter") 33, and a distance calculation unit 34.

The optical interference unit 31 is connected to the O/E converter 32 via an optical fiber.

The optical interference unit 31 causes the reflected light output from the circulator 22 to interfere with the reference light output from the optical coupler 21, and outputs interference light between the reflected light and the reference light to the O/E converter 32.

The O/E converter 32 converts the interference light output from the optical interference unit 31 into an electric signal (hereinafter referred to as "interference signal"), and outputs the interference signal to the A/D converter 33.

The A/D converter 33 subjects the interference signal output from the O/E converter 32 to conversion from an analog signal to a digital signal, and outputs the digital signal to the distance calculation unit 34.

Figure 3:
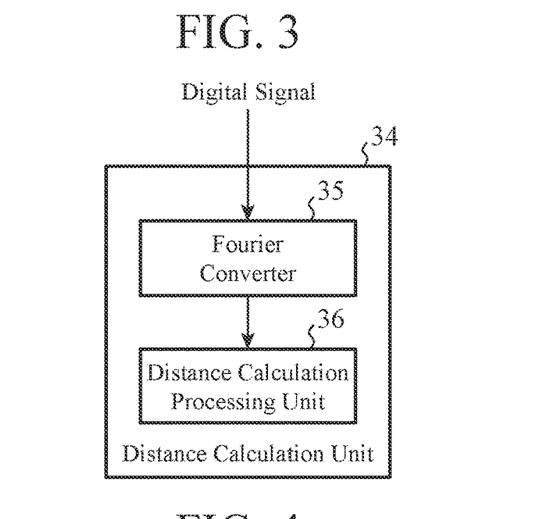
FIG. 3 is a configuration diagram illustrating a distance calculation unit 34 of the optical distance measurement device 3 according to the first embodiment.

As shown in FIG. 3, the distance calculation unit 34 is provided with a Fourier converter 35, and a distance calculation processing unit 36.

FIG. 3 is a configuration diagram illustrating the distance calculation unit 34 of the optical distance measurement device 3 according to the first embodiment.

Figure 4:
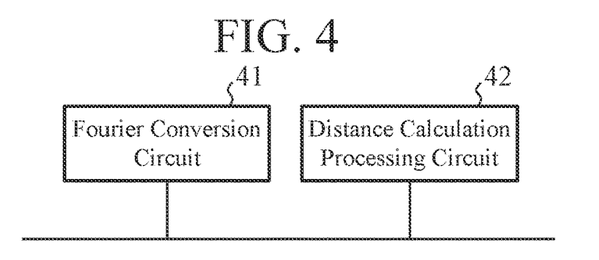
FIG. 4 is a hardware configuration diagram illustrating hardware of the distance calculation unit 34.

FIG. 4 is a hardware configuration diagram illustrating hardware of the distance calculation unit 34.

In FIG. 3, the Fourier converter 35 is implemented by a Fourier conversion circuit 41 shown in FIG. 4.

The Fourier converter 35 performs processing of: calculating a frequency spectrum of interference light by subjecting the digital signal output from the A/D converter 33 to Fourier transform; and outputs the frequency spectrum to the distance calculation processing unit 36.

The distance calculation processing unit 36 is implemented by a distance calculation processing circuit 42 shown in FIG. 4.

The distance calculation processing unit 36 performs processing of calculating a difference between a frequency related to a frequency component of the reflected light and a frequency related to a frequency component of the reference light on the basis of the frequency spectrum output from the Fourier converter 35.

In addition, the distance calculation processing unit 36 performs processing of calculating, from the calculated difference, a distance from the optical distance measurement device 3 to the measurement target 1.

FIG. 3 assumes that each of the Fourier converter 35 and the distance calculation processing unit 36, which are components of the distance calculation unit 34, is implemented by dedicated hardware such as that shown in FIG. 4. In other words, it is assumed that the distance calculation unit 34 is implemented by the Fourier conversion circuit 41 and the distance calculation processing circuit 42.

For example, a single circuit, a composite circuit, a programmed processor, a parallel-programmed processor, an Application Specific Integrated Circuit (ASIC), a Field-Programmable Gate Array (FPGA), or a combination of these components, are applicable to each of the Fourier conversion circuit 41 and the distance calculation processing circuit 42.

The components of the distance calculation unit 34 are not limited to those implemented by dedicated hardware. The distance calculation unit 34 may be implemented by software, firmware or a combination of software and firmware.

Software or firmware is stored in a memory of a computer as a program. The computer means hardware that executes a program. For example, a Central Processing Unit (CPU), a central processing element, a processing element, a computing element, a microprocessor, a microcomputer, a processor, or a Digital Signal Processor (DSP) is applicable to the computer.

Figure 5:
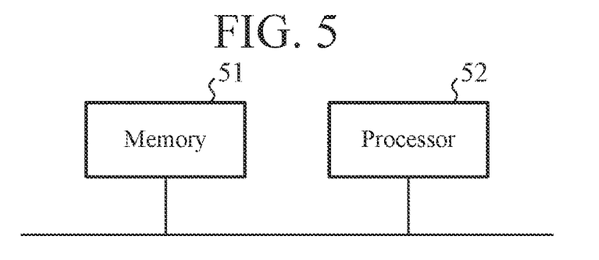

FIG. 5 is a hardware configuration diagram of a computer used in a case where the distance calculation unit 34 is implemented by software, firmware or the like.

In a case where the distance calculation unit 34 is implemented by software, firmware or the like, a program that causes the computer to execute processing steps of the Fourier converter 35 and the distance calculation processing unit 36 is stored in a memory 51. Subsequently, a processor 52 of the computer executes the program stored in the memory 51.

In addition, FIG. 4 shows an example in which the components of the distance calculation unit 34 are each implemented by dedicated hardware, and FIG. 5 shows an example in which the distance calculation unit 34 is implemented by software, firmware or the like. However, while a part of the components of the distance calculation unit 34 is implemented by dedicated hardware, remaining components may be implemented by software, firmware or the like.

Figure 6:
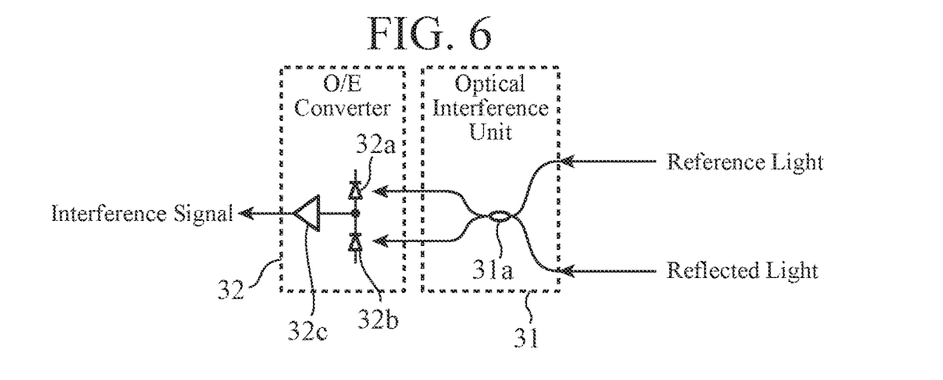
FIG. 6 is a configuration diagram illustrating the inside of an optical interference unit 31 and the inside of an O/E converter 32.

FIG. 6 is a configuration diagram illustrating the inside of the optical interference unit 31 and the inside of the O/E converter 32.

In FIG. 6, the optical coupler 31a multiplexes the reflected light output from the circulator 22 and the reference light output from the optical coupler 21.

In addition, the optical coupler 31a demultiplexes the multiplexed light of the reflected light and the reference light into two light beams, and outputs each of the demultiplexed light beams to a corresponding one of PIN photodiodes 32a, 32b as interference light.

Each of the PIN photodiodes 32a, 32b is an element through which a current flows, the current being directly proportional to the light intensity of the interference light output from the optical coupler 31a.

An electric signal having a voltage that is directly proportional to the light intensity of the interference light appears at a connection point of the PIN photodiode 32a and the PIN photodiode 32b.

An amplifier 32c amplifies the electric signal, and outputs the amplified electric signal to the A/D converter 33 as an interference signal.

Figure 7:
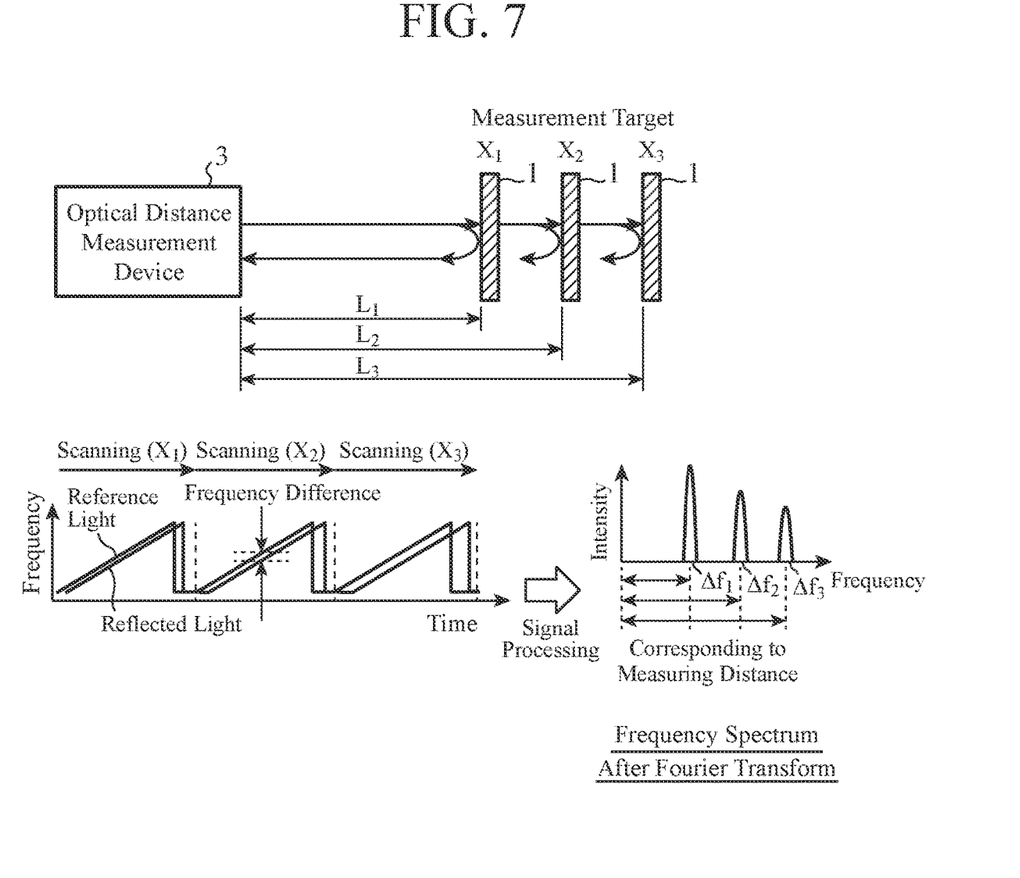
FIG. 7 is an explanatory diagram illustrating distance measurement processing performed by the optical distance measurement device 3.

FIG. 7 is an explanatory diagram illustrating distance measurement processing performed by the optical distance measurement device 3.

FIG. 7 shows an example in which the optical distance measurement device 3 measures distances to three measurement targets 1.

The three measurement targets 1 presented in FIG. 7 are located at respective positions $X_1$, $X_2$, $X_3$, and distances thereto from the optical distance measurement device 3 are $L_1$, $L_2$, $L_3$, respectively, and $L_1 < L_2 < L_3$.

Next, the operation of the optical distance measurement device 3 shown in FIG. 2 will be described.

The frequency-swept light output unit 10 repeatedly outputs frequency-swept light to a light transmission and reception unit 20, the frequency-swept light changing in frequency with time.

Output operation of outputting frequency-swept light by the frequency-swept light output unit 10 will be specifically described below.

The sweep electric signal output unit 11 outputs a sawtooth wave signal to the delay unit 12 and the first laser light source 13 as a sweep electric signal, the frequency of which changes with time.

Figure 8:
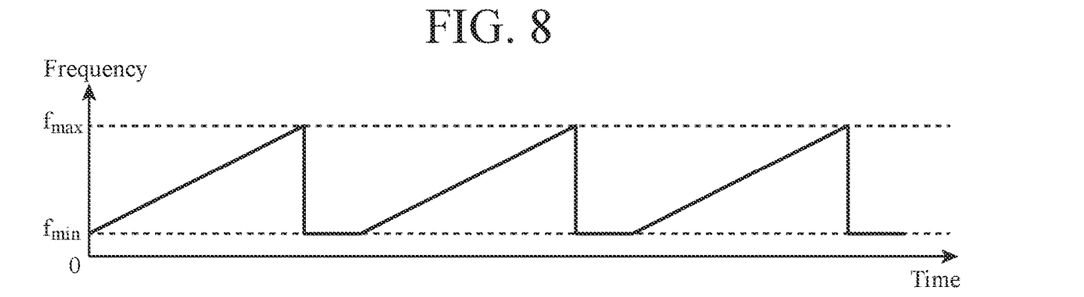
FIG. 8 is an explanatory diagram illustrating a waveform of a sawtooth wave signal.

FIG. 8 is an explanatory diagram illustrating a waveform of the sawtooth wave signal.

The sawtooth wave signal is a signal in which a voltage or a current changes to cause a frequency of the first frequency-swept light and a frequency of the second frequency-swept light to change from the lowest frequency $f_{min}$ to the highest frequency $f_{max}$ with time.

When the frequency returns to the lowest frequency $f_{min}$, after a lapse of a fixed time period, the first frequency-swept light and the second frequency-swept light change in frequency from the lowest frequency $f_{min}$ to the highest frequency $f_{max}$.

The reason why the first frequency-swept light and the second frequency-swept light change in frequency after a lapse of a fixed time period is that the time is required when the frequency of the first frequency-swept light and the frequency of the second frequency-swept light return from the highest frequency $f_{max}$ to the lowest frequency $f_{min}$.

While the selector 15 keeps the first frequency-swept light selected, the sweep electric signal output unit 11 monitors the frequency f of the sawtooth wave signal that is being output to the first laser light source 13.

When the frequency f of the sawtooth wave signal that is being output to the first laser light source 13 reaches the highest frequency $f_{max}$, the sweep electric signal output unit 11 outputs, to the selector 15, the second selector switching signal indicating that the second frequency-swept light is selected.

As the timing in which a switch is made from the first frequency-swept light to the second frequency-swept light, the sweep electric signal output unit 11 detects the timing in which the frequency f of the sawtooth wave signal that is being output to the first laser light source 13 reaches the highest frequency $f_{max}$.

In addition, while the selector 15 keeps the second frequency-swept light selected, the sweep electric signal output unit 11 monitors the frequency f of the delayed sawtooth wave signal output from the delay unit 12.

When the frequency f of the delayed sawtooth wave signal reaches the highest frequency $f_{max}$, the sweep electric signal output unit 11 outputs, to the selector 15, the first selector switching signal indicating that the first frequency-swept light is selected.

As the timing in which a switch is made from the second frequency-swept light to the first frequency-swept light, the sweep electric signal output unit 11 detects the timing in which the frequency f of the delayed sawtooth wave signal reaches the highest frequency $f_{max}$.

When the delay unit 12 receives the sawtooth wave signal from the sweep electric signal output unit 11, the delay unit 12 delays the sawtooth wave signal, and outputs the delayed sawtooth wave signal to the second laser light source 14.

The delay time of the sawtooth wave signal delayed by the delay unit 12 will be described later.

When the first laser light source 13 receives the sawtooth wave signal from the sweep electric signal output unit 11, the first laser light source 13 outputs, to the selector 15, the first frequency-swept light in which a change in frequency with time is in synchronization with a change in sawtooth wave signal.

When the second laser light source 14 receives the sawtooth wave signal output from the delay unit 12, the second laser light source 14 outputs, to the selector 15, the second frequency-swept light in which a change in frequency with time is in synchronization with a change in sawtooth wave signal.

Figure 9:
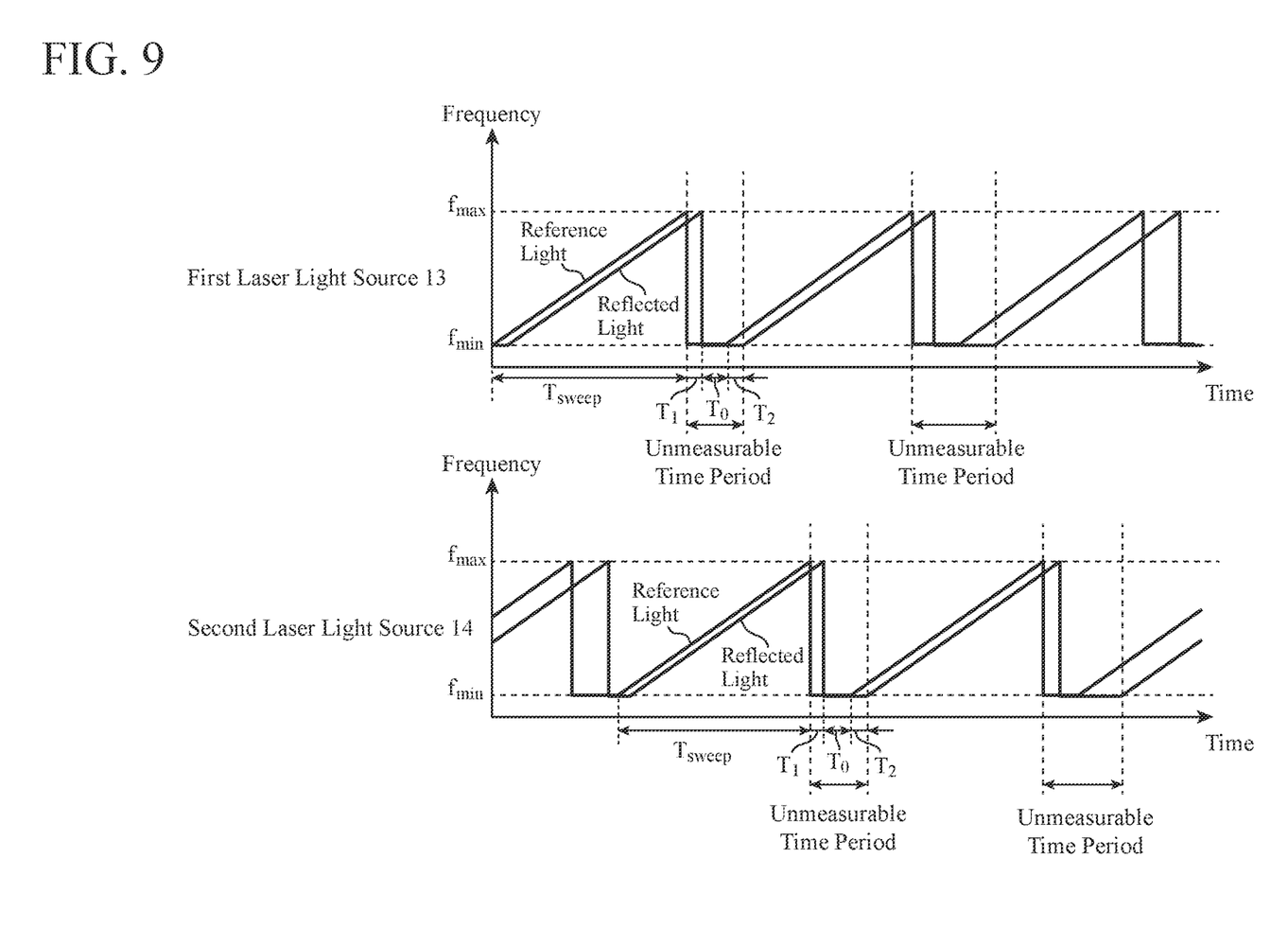
FIG. 9 is an explanatory diagram illustrating reference light as first frequency-swept light output from a first laser light source 13, and reflected light, reference light as second frequency-swept light output from a second laser light source 14, and reflected light.

FIG. 9 is an explanatory diagram illustrating reference light as first frequency-swept light output from the first laser light source 13, and reflected light, reference light as second frequency-swept light output from the second laser light source 14, and reflected light.

When a frequency of the first frequency-swept light and a frequency of the second frequency-swept light each reaches the highest frequency $f_{max}$, the frequency temporarily returns to the lowest frequency $f_{min}$, and subsequently frequency sweeping is restarted.

When the frequency of the first frequency-swept light and the frequency of the second frequency-swept light each returns to the lowest frequency $f_{min}$, a fixed time period is required before frequency sweeping is restarted, and therefore the frequency is kept at the lowest frequency $f_{min}$ for a fixed time period. A time period during which the frequency is kept at the lowest frequency $f_{min}$ is a time period during which a distance cannot be measured.

However, a time period during which the frequency of the first frequency-swept light is kept at the lowest frequency $f_{min}$ deviates from a time period during which the frequency of the second frequency-swept light is kept at the lowest frequency $f_{min}$.

In a time period during which the frequency of the first frequency-swept light is kept at the lowest frequency $f_{min}$, the frequency of the second frequency-swept light is higher than the lowest frequency $f_{min}$.

In addition, in a time period during which the frequency of the second frequency-swept light is kept at the lowest frequency $f_{min}$, the frequency of the first frequency-swept light is higher than the lowest frequency $f_{min}$.

When the selector 15 receives the first selector switching signal from the sweep electric signal output unit 11, the selector 15 selects the first frequency-swept light from between the first frequency-swept light and the second frequency-swept light, and then outputs the first frequency-swept light to the optical coupler 21.

When the selector 15 receives the second selector switching signal from the sweep electric signal output unit 11, the selector 15 selects the second frequency-swept light from between the first frequency-swept light and the second frequency-swept light, and then outputs the second frequency-swept light to the optical coupler 21.

The light transmission and reception unit 20 outputs the first frequency-swept light or the second frequency-swept light, which has been output from the frequency-swept light output unit 10, to the signal processing unit 30 as reference light.

In addition, the light transmission and reception unit 20 irradiates the measurement target 1 with the first frequency-swept light or the second frequency-swept light, which has been output from the frequency-swept light output unit 10, as irradiation light, receives the irradiation light reflected by the measurement target 1 as reflected light, and outputs the reflected light to the signal processing unit 30.

Irradiation-light irradiating operation and reflected-light receiving operation performed by the light transmission and reception unit 20 will be specifically described below.

When the optical coupler 21 receives frequency-swept light (the first frequency-swept light or the second frequency-swept light) from the selector 15, the optical coupler 21 causes the frequency-swept light to branch into two frequency-swept light beams.

The optical coupler 21 outputs one frequency-swept light beam after branching to the circulator 22, and outputs the other frequency-swept light beam after branching to the optical interference unit 31 as reference light.

The circulator 22 outputs the frequency-swept light output from the optical coupler 21 to the collimator lens 23.

When the collimator lens 23 receives the frequency-swept light from the circulator 22, the collimator lens 23 adjusts a beam diameter of the frequency-swept light in such a manner that the frequency-swept light becomes parallel light. The frequency-swept light, the beam diameter of which has been adjusted by the collimator lens 23, is emitted to space toward the measurement target 1 as irradiation light.

The collimator lens 23 concentrates, as reflected light, the irradiation light reflected by the measurement target 1, and outputs the reflected light to the circulator 22.

When the circulator 22 receives the reflected light from the collimator lens 23, the circulator 22 outputs the reflected light to the optical interference unit 31.

The optical interference unit 31 causes the reflected light output from the circulator 22 to interfere with the reference light output from the optical coupler 21, and outputs interference light between the reflected light and the reference light to the O/E converter 32.

When the O/E converter 32 receives the interference light from the optical interference unit 31, the O/E converter 32 converts the interference light into an interference signal, and outputs the interference signal to the A/D converter 33.

When the A/D converter 33 receives the interference signal from the O/E converter 32, the A/D converter 33 subjects the interference signal to conversion from an analog signal to a digital signal, and outputs the digital signal to the distance calculation unit 34.

When the Fourier converter 35 of the distance calculation unit 34 receives the digital signal from the A/D converter 33, the Fourier converter 35 calculates a frequency spectrum of interference light by subjecting the digital signal to Fourier transform, and outputs the frequency spectrum to the distance calculation processing unit 36.

The time at which the reflected light arrives at the optical interference unit 31 is later than the time at which the reference light arrives at the optical interference unit 31, and therefore a time difference occurs between the arrival time at which the reflected light arrives at the optical interference unit 31 and the arrival time at which the reference light arrives at the optical interference unit 31.

The frequency spectrum includes a component of a frequency difference corresponding to the above-described time difference, and the frequency difference is directly proportional to a distance to the measurement target 1. The frequency difference is a difference between the frequency of the reflected light and the frequency of the reference light.

FIG. 7 shows, as an example, the measurement target 1, the distance of which from the optical distance measurement device 3 is $L_1$, the measurement target 1, the distance of which from the optical distance measurement device 3 is $L_2$, and the measurement target 1, the distance of which from the optical distance measurement device 3 is $L_3$.

In the example shown in FIG. 7, in a case where reflected light that has arrived at the optical interference unit 31 is reflected light reflected by the measurement target 1, the distance of which from the optical distance measurement device 3 is $L_1$, a frequency difference $\Delta f$ between the frequency of the reflected light and the frequency of the reference light is $\Delta f_1$. The reflected light reflected by the measurement target 1, the distance of which from the optical distance measurement device 3 is $L_1$, is reflected light during a time period indicated by scanning $(X_1)$.

In a case where reflected light that has arrived at the optical interference unit 31 is reflected light reflected by the measurement target 1, the distance of which from the optical distance measurement device 3 is $L_2$, the frequency difference $\Delta f$ is $\Delta f_2$. The reflected light reflected by the measurement target 1, the distance of which from the optical distance measurement device 3 is $L_2$, is reflected light during a time period indicated by scanning ($X_2$).

In a case where reflected light that has arrived at the optical interference unit 31 is reflected light reflected by the measurement target 1, the distance of which from the optical distance measurement device 3 is $L_3$, the frequency difference $\Delta f$ is $\Delta f_3$. The reflected light reflected by the measurement target 1, the distance of which from the optical distance measurement device 3 is $L_3$, is reflected light during a time period indicated by scanning ($X_3$). They satisfy $\Delta f_1 < \Delta f_2 < \Delta f_3$.

When the distance calculation processing unit 36 receives the frequency spectrum from the Fourier converter 35, the distance calculation processing unit 36 calculates the frequency difference $\Delta f$ included in the frequency spectrum.

From the frequency difference $\Delta f$, the distance calculation processing unit 36 calculates a distance L from the optical distance measurement device 3 to the measurement target 1.

Processing itself of calculating a distance L from the frequency difference $\Delta f$ is a publicly known technology, and therefore detailed description thereof will be omitted.

Here, the delay time of the sawtooth wave signal delayed by the delay unit 12 will be described.

An initial value of the delay time of the sawtooth wave signal is 0.

In a case where the delay time is 0, a distance unmeasurable time period during which a distance cannot be measured by the first frequency-swept light agrees with a distance unmeasurable time period during which a distance cannot be measured by the second frequency-swept light.

As shown in FIG. 9, the distance unmeasurable time period includes a time period $T_0$ during which the frequency difference $\Delta f$ between the frequency of the reflected light and the frequency of the reference light is 0.

The distance calculation processing unit 36 measures the time period $T_0$ during which the frequency difference $\Delta f$ is 0.

If sweep time of frequency-swept light (the first frequency-swept light, the second frequency-swept light) is $T_{sweep}$, the distance calculation processing unit 36 sets delay time $T_d$ of the sawtooth wave signal as shown in the following formula (1).

$$T_0 + \alpha < T_d < T_{sweep} - (T_0 + \alpha) \quad (1)$$

In this formula (1), $\alpha$ is a coefficient corresponding to time differences $T_1$, $T_2$ between the arrival time at which the reflected light arrives at the optical interference unit 31 and the arrival time at which the reference light arrives at the optical interference unit 31. However, the time differences $T_1$, $T_2$ change depending on the distance to the measurement target 1. Therefore, with respect to the time differences $T_1$, $T_2$, the coefficient $\alpha$ is set on the basis of time differences $T_{max1}$, $T_{max2}$ corresponding to a maximum value $L_{max}$ of a measurable distance in the optical distance measurement device 3.

$$\alpha = T_{max1} + T_{max2} \quad (2)$$

The distance calculation processing unit 36 outputs the delay time $T_d$ of the sawtooth wave signal to the delay unit 12. The delay time of the delay unit 12 is set at the delay time $T_d$ output from the distance calculation processing unit 36.

Here, the distance calculation processing unit 36 sets the delay time $T_d$ of the sawtooth wave signal according to formula (1) and formula (2). However, this is merely an example. The distance calculation processing unit 36 may set the delay time $T_d$ in such a manner that the time at which the first frequency-swept light is selected by the selector 15 is equal to the time at which the second frequency-swept light is selected by the selector 15. In addition, the distance calculation processing unit 36 may set the delay time $T_d$ in such a manner that a ratio between the time at which the first frequency-swept light is selected by the selector 15 and the time at which the second frequency-swept light is selected by the selector 15 is constant.

In the first embodiment described above, the optical distance measurement device 3 is configured in such a manner that the frequency-swept light output unit 10 outputs frequency-swept light during a time period from when frequency sweeping of frequency-swept light being output is completed to when the next frequency sweeping becomes possible, the frequency-swept light output during the time period being frequency swept at a different frequency from the frequency-swept light being output. Therefore, the optical distance measurement device 3 is capable of eliminating a time period during which a distance to the measurement target 1 cannot be measured.

With respect to the optical distance measurement device 3 according to the first embodiment, the frequency changing range of the first frequency-swept light is the same as the frequency changing range of the second frequency-swept light.

However, this is merely an example. The frequency changing range of the first frequency-swept light may differ from the frequency changing range of the second frequency-swept light.

Figure 10:
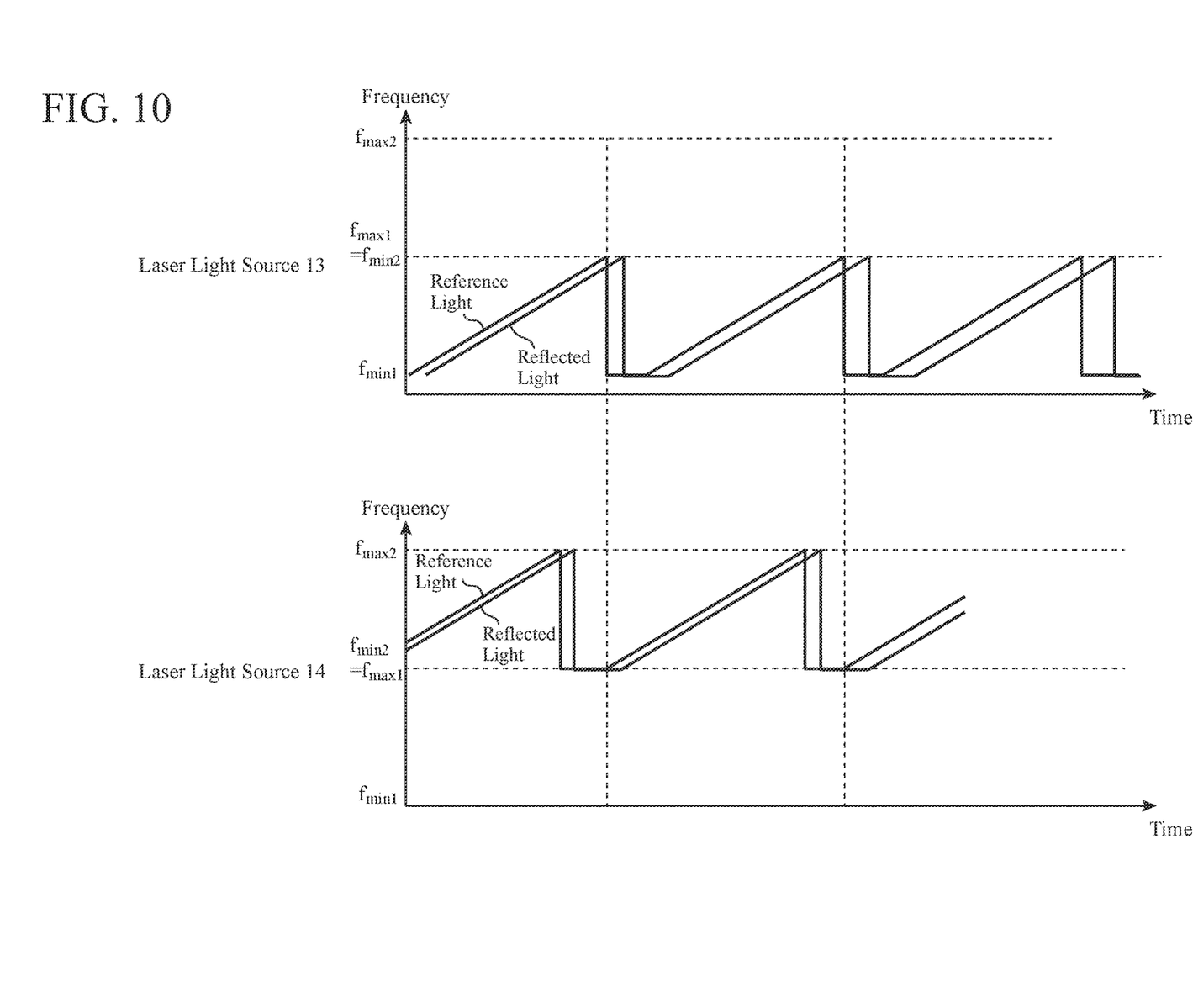
FIG. 10 is an explanatory diagram illustrating a frequency changing range of the first frequency-swept light output from the first laser light source 13, and a frequency changing range of the second frequency-swept light output from the second laser light source 14.

FIG. 10 is an explanatory diagram illustrating a frequency changing range of the first frequency-swept light output from the first laser light source 13, and a frequency changing range of the second frequency-swept light output from the second laser light source 14.

In an example shown in FIG. 10, the frequency changing range of the first frequency-swept light ranges from the lowest frequency $f_{min1}$ to the highest frequency $f_{max1}$, and the frequency changing range of the second frequency-swept light ranges from the lowest frequency $f_{min2}$ to the highest frequency $f_{max2}$.

In the example shown in FIG. 10, $f_{max1} = f_{min2}$. Therefore, a changing range of frequency-swept light output from the frequency-swept light output unit 10 ranges from the lowest frequency $f_{min1}$ to the highest frequency $f_{max2}$.

The frequency change amount $C_1$ of the first frequency-swept light is calculated by $f_{max1} - f_{min1}$, and the frequency change amount $C_2$ of the second frequency-swept light is calculated by $f_{max2} - f_{min2}$.

In addition, as shown in FIG. 9, the frequency change amount $C_3$ obtained in a case where the frequency changing range of the first frequency-swept light is the same as the frequency changing range of the second frequency-swept light is calculated by $f_{max} - f_{min}$.

In this case, on the assumption that $C_1 = C_2 = C_3$, in a case where the frequency changing range of the first frequency-swept light differs from the frequency changing range of the second frequency-swept light, the optical distance measurement device 3 is capable of extending a dynamic range of a measuring distance in comparison with the case where the frequency changing ranges are the same.

With respect to the optical distance measurement device 3 according to the first embodiment, the frequency-swept light output unit 10 is provided with two laser light sources (the first laser light source 13, the second laser light source 14). The frequency-swept light output unit 10 may be provided with three or more laser light sources.

In a case where the frequency-swept light output unit 10 is provided with three or more laser light sources, the selector 15 selects one frequency-swept light beam from among three or more frequency-swept light beams, and outputs the selected frequency-swept light beam to the light transmission and reception unit 20.

The frequency-swept light beam selected by the selector 15 is a frequency-swept light beam, the frequency of which is not the lowest frequency $f_{min}$.

Second Embodiment

Figure 11:
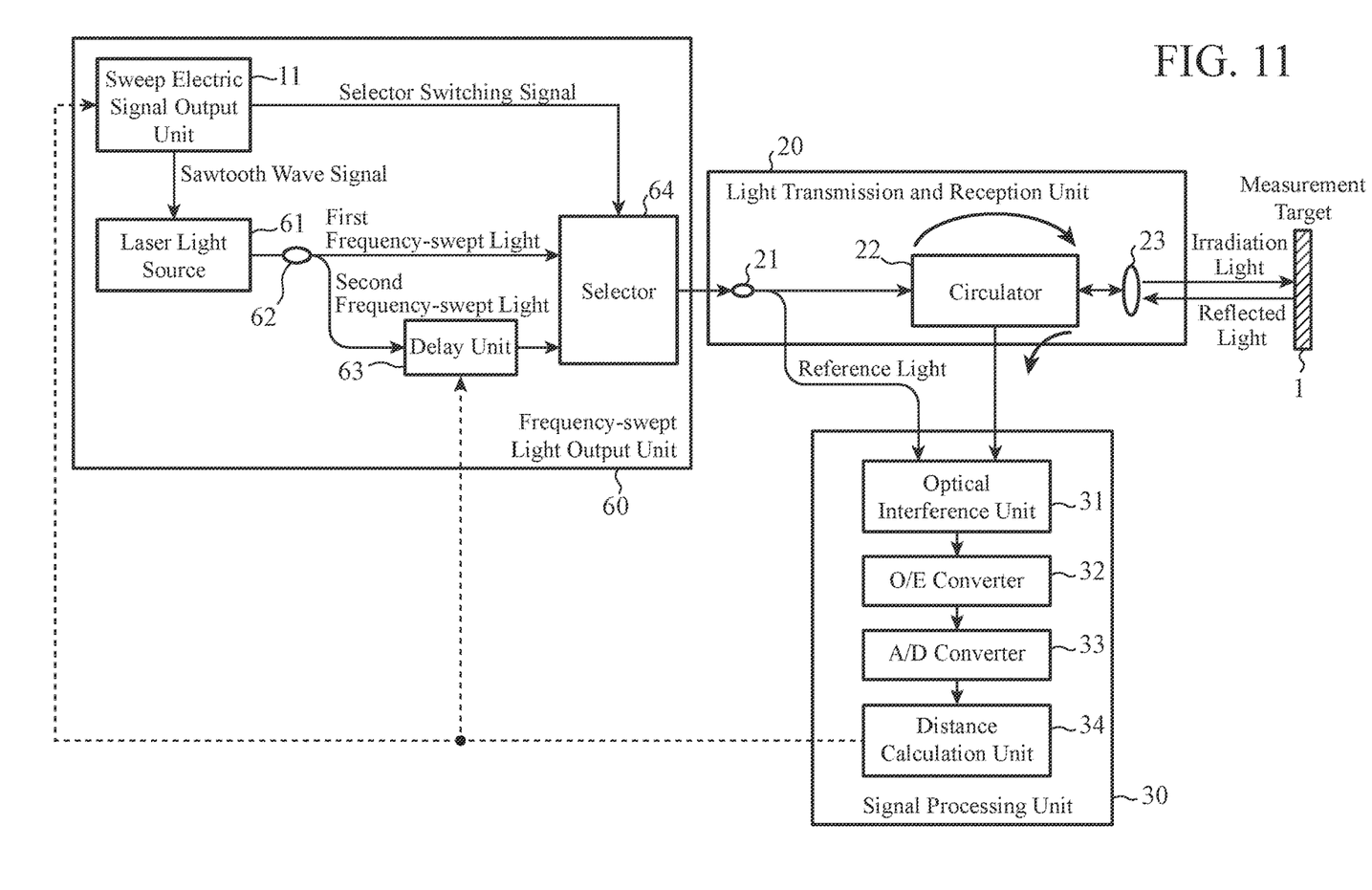
FIG. 11 is a configuration diagram illustrating an optical distance measurement device 3 according to a second embodiment.

With respect to an optical distance measurement device 3 according to a second embodiment, a frequency-swept light output unit 60 is provided with one laser light source 61.

FIG. 11 is a configuration diagram illustrating the optical distance measurement device 3 according to the second embodiment.

In FIG. 11, reference numerals identical to those used in FIG. 2 indicate identical or corresponding components, and therefore the explanation thereof will be omitted.

The frequency-swept light output unit 60 is provided with a sweep electric signal output unit 11, the laser light source 61, an optical coupler 62, a delay unit 63, and a selector 64.

The frequency-swept light output unit 60 outputs frequency-swept light to the light transmission and reception unit 20 during a time period from when frequency sweeping of frequency-swept light being output is completed to when the next frequency sweeping becomes possible, the frequency-swept light output during the time period being frequency swept at a different frequency from the frequency-swept light being output.

The laser light source 61 is connected to the optical coupler 62 via an optical fiber.

The laser light source 61 repeatedly outputs frequency-swept light, the frequency of which changes with time, to the optical coupler 62 on the basis of a sawtooth wave signal output from the sweep electric signal output unit 11.

The optical coupler 62 is connected to the delay unit 63 via an optical fiber, and is connected to the selector 64 via an optical fiber.

The optical coupler 62 causes frequency-swept light output from the laser light source 61 to branch into two frequency-swept light beams, outputs one frequency-swept light beam after branching to the selector 64 as first frequency-swept light, and outputs the other frequency-swept light beam after branching to the delay unit 63 as second frequency-swept light.

The delay unit 63 is connected to the selector 64 via an optical fiber.

The delay unit 63 delays the second frequency-swept light output from the optical coupler 62, and outputs the delayed second frequency-swept light to the selector 64.

The selector 64 is connected to an optical coupler 21 of the light transmission and reception unit 20 via an optical fiber.

When the selector 64 receives the first selector switching signal from the sweep electric signal output unit 11, the selector 64 selects the first frequency-swept light from between the first frequency-swept light and the second frequency-swept light, and then outputs the first frequency-swept light to the optical coupler 21.

When the selector 64 receives the second selector switching signal from the sweep electric signal output unit 11, the selector 64 selects the second frequency-swept light from between the first frequency-swept light and the second frequency-swept light, and then outputs the second frequency-swept light to the optical coupler 21.

Next, the operation of the optical distance measurement device 3 shown in FIG. 11 will be described.

However, components other than the frequency-swept light output unit 60 are similar to those of the optical distance measurement device 3 shown in FIG. 2, and therefore only the operation of the frequency-swept light output unit 60 will be described.

As a sweep electric signal that causes frequency of frequency-swept light output from the laser light source 61 to change with time, the sweep electric signal output unit 11 outputs a sawtooth wave signal shown in FIG. 8 to the laser light source 61.

In addition, the sweep electric signal output unit 11 delays the sawtooth wave signal only by the delay time output from the distance calculation unit 34.

While the selector 64 keeps the first frequency-swept light selected, the sweep electric signal output unit 11 monitors the frequency f of the sawtooth wave signal that is being output to the laser light source 61.

When the frequency f of the sawtooth wave signal that is being output to the laser light source 61 reaches the highest frequency $f_{max}$, the sweep electric signal output unit 11 outputs, to the selector 64, the second selector switching signal indicating that the second frequency-swept light is selected.

While the selector 64 keeps the second frequency-swept light selected, the sweep electric signal output unit 11 monitors the frequency f of the delayed sawtooth wave signal.

When the frequency f of the delayed sawtooth wave signal reaches the highest frequency $f_{max}$, the sweep electric signal output unit 11 outputs, to the selector 64, the first selector switching signal indicating that the first frequency-swept light is selected.

When the laser light source 61 receives the sawtooth wave signal from the sweep electric signal output unit 11, the laser light source 61 outputs, to the optical coupler 62, the frequency-swept light in which a change in frequency with time is in synchronization with a change in sawtooth wave signal.

When the optical coupler 62 receives the frequency-swept light from the laser light source 61, the optical coupler 62 causes the frequency-swept light to branch into two frequency-swept light beams.

The optical coupler 62 outputs one frequency-swept light beam after branching to the selector 64 as first frequency-swept light, and outputs the other frequency-swept light beam after branching to the delay unit 63 as second frequency-swept light.

When the delay unit 63 receives the second frequency-swept light from the optical coupler 62, the delay unit 63 delays the second frequency-swept light, and outputs the delayed second frequency-swept light to the selector 64.

The delay time of the second frequency-swept light delayed by the delay unit 63 is the same as the delay time of the sawtooth wave signal delayed by the delay unit 12 shown in FIG. 2.

When the selector 64 receives the first selector switching signal from the sweep electric signal output unit 11, the selector 64 selects the first frequency-swept light from between the first frequency-swept light and the second frequency-swept light, and then outputs the first frequency-swept light to the optical coupler 21.

When the selector 64 receives the second selector switching signal from the sweep electric signal output unit 11, the selector 64 selects the second frequency-swept light from between the first frequency-swept light and the second frequency-swept light, and then outputs the second frequency-swept light to the optical coupler 21.

According to the second embodiment, the number of laser light sources with which the frequency-swept light output unit 60 is provided is one, and therefore the optical distance measurement device 3 according to the second embodiment can be more miniaturized than the optical distance measurement device 3 according to the first embodiment.

With respect to the optical distance measurement device 3 according to the second embodiment, the frequency-swept light output unit 60 is required to be provided with the optical coupler 62 and the delay unit 63. However, the optical coupler 62 and the delay unit 63 are smaller than the laser light source.

In the optical distance measurement device 3 according to the second embodiment, the optical coupler 62 causes the first frequency-swept light to branch into two frequency-swept light beams, and consequently the two frequency-swept light beams are output to the selector 64. However, this is merely an example. For example, by connecting a plurality of optical couplers 62 in multiple stages, three or more frequency-swept light beams may be output to the selector 64. In a case where three or more frequency-swept light beams are output to the selector 64, the delay units 63 are connected to the respective optical couplers 62 that are connected in multiple stages.

The selector 64 selects one frequency-swept light beam from among three or more frequency-swept light beams, and then outputs the selected frequency-swept light beam to the light transmission and reception unit 20.

The frequency-swept light beam selected by the selector 64 is a frequency-swept light beam being frequency swept, the frequency of which is not the lowest frequency $f_{min}$.

It should be noted that a free combination of embodiments, or a modification of an arbitrary component of each embodiment, or an omission of an arbitrary component in each embodiment can be made in the invention of the present application within the scope of the invention.

INDUSTRIAL APPLICABILITY

The present invention is suitable for an optical distance measurement device that calculates a distance to a measurement target.

In addition, the present invention is suitable for a processing device provided with an optical distance measurement device.

REFERENCE SIGNS LIST

1: Measurement target,
2: Processing device,
3: Optical distance measurement device,
4: Processing unit (Processing machine),
10: Frequency-swept light output unit,
11: Sweep electric signal output unit (Sweep electric signal output circuit),
12: Delay unit (Delay circuit),
13: First laser light source,
14: Second laser light source,
15: Selector,
20: Light transmission and reception unit,
21: Optical coupler,
22: Circulator,
23: Collimator lens,
30: Signal processing unit,
31: Optical interference unit,
31a: Optical coupler,
32: O/E converter,
32a and 32b: PIN photodiode,
32c: Amplifier,
33: A/D converter,
34: Distance calculation unit,
35: Fourier converter,
36: Distance calculation processing unit,
41: Fourier conversion circuit,
42: Distance calculation processing circuit (Processing circuitry),
51: Memory,
52: Processor,
60: Frequency-swept light output unit,
61: Laser light source,
62: Optical coupler,
63: Delay unit, and
64: Selector

What is claimed is:

1. An optical distance measurement device comprising:
processing circuitry
to repeatedly output frequency-swept light, a frequency of which changes with time;
to output, as reference light, the frequency-swept light, and to irradiate a measurement target with the frequency-swept light to receive, as reflected light, frequency-swept light reflected by the measurement target;
to cause the reflected light and the reference light to interfere with each other, and to output interference light between the reflected light and the reference light; and
to calculate a difference between a frequency of the reflected light and a frequency of the reference light on a basis of the interference light, and to calculate, from the difference, a a distance to the measurement target,
wherein the processing circuitry outputs another frequency-swept light during a time period from when frequency sweeping of the frequency-swept light being output is completed to when the next frequency sweeping becomes possible after it has reset to the original starting frequency, the another frequency-swept light output during the time period being frequency swept at a different frequency from the frequency-swept light being output.

2. The optical distance measurement device according to claim 1, wherein
the processing circuitry includes
a sweep electric signal output circuit to output a sweep electric signal, a frequency of which changes with time,
a delay circuit to delay the sweep electric signal output from the sweep electric signal output circuit,
a first laser light source to repeatedly output first frequency-swept light, a frequency of which changes with time, on a basis of the sweep electric signal output from the sweep electric signal output circuit,
a second laser light source to repeatedly output second frequency-swept light, a frequency of which changes with time, on a basis of the sweep electric signal delayed by the delay circuit, and
a selector to select the first frequency-swept light output from the first laser light source or the second frequency-swept light output from the second laser light source, and to output the selected frequency-swept light, while the selector keeps the first frequency-swept light selected, the sweep electric signal output circuit detects, on a basis of a frequency of a sweep electric signal being output to the first laser light source, timing in which a switch is made from the first frequency-swept light to the second frequency-swept light, when the timing in which a switch is made to the second frequency-swept light has been detected, the sweep electric signal output circuit outputs, to the selector, a second selector switching signal indicating that the second frequency-swept light is selected, while the selector keeps the second frequency-swept light selected, the sweep electric signal output circuit detects, on a basis of a frequency of the sweep electric signal delayed by the delay circuit, timing in which a switch is made from the second frequency-swept light to the first frequency-swept light, and when the timing in which a switch is made to the first frequency-swept light has been detected, the sweep electric signal output circuit outputs, to the selector, a first selector switching signal indicating that the first frequency-swept light is selected, and when the selector receives the first selector switching signal from the sweep electric signal output circuit, the selector selects the first frequency-swept light, and when the selector receives the second selector switching signal from the sweep electric signal output circuit, the selector selects the second frequency-swept light.

3. The optical distance measurement device according to claim 1, wherein the processing circuitry includes a sweep electric signal output circuit to output a sweep electric signal, a frequency of which changes with time, a laser light source to repeatedly output frequency-swept light, a frequency of which changes with time, on a basis of the sweep electric signal output from the sweep electric signal output circuit, an optical coupler for causing frequency-swept light output from the laser light source to branch into two frequency-swept light beams, outputting one frequency-swept light beam after branching as first frequency-swept light, and to output the other frequency-swept light beam after branching as second frequency-swept light, a delay circuit to delay the second frequency-swept light output from the optical coupler, and a selector to select the first frequency-swept light output from the optical coupler or the second frequency-swept light delayed by the delay circuit, and to output the selected frequency-swept light, the sweep electric signal output circuit delays the sweep electric signal only by the same delay time as delay time of the second frequency-swept light delayed by the delay circuit, while the selector keeps the first frequency-swept light selected, detects, on a basis of a frequency of a sweep electric signal being output to the laser light source, timing in which a switch is made from the first frequency-swept light to the second frequency-swept light, when the timing in which a switch is made to the second frequency-swept light has been detected, outputs, to the selector, a second selector switching signal indicating that the second frequency-swept light is selected, while the selector keeps the second frequency-swept light selected, detects, on a basis of a frequency of a sweep electric signal being delayed, timing in which a switch is made from the second frequency-swept light to the first frequency-swept light, and when the timing in which a switch is made to the first frequency-swept light has been detected, outputs, to the selector, a first selector switching signal indicating that the first frequency-swept light is selected, and when the selector receives the first selector switching signal from the sweep electric signal output circuit, the selector selects the first frequency-swept light, and when the selector receives the second selector switching signal from the sweep electric signal output circuit, the selector selects the second frequency-swept light.

4. A processing device comprising:

an optical distance measurement device to measure a distance to a measurement target; and a processing machine to process the measurement target on a basis of the distance measured by the optical distance measurement device, wherein the optical distance measurement device includes processing circuitry to repeatedly output frequency-swept light, a frequency of which changes with time, to output, as reference light, the frequency-swept light, and to irradiate a measurement target with the frequency-swept light to receive, as reflected light, frequency-swept light reflected by the measurement target, to cause the reflected light and the reference light to interfere with each other, and to output interference light between the reflected light and the reference light, and to calculate a difference between a frequency of the reflected light and a frequency of the reference light on a basis of the interference light, and to calculate, from the difference, a distance to the measurement target, and the processing circuitry outputs another frequency-swept light during a time period from when frequency sweeping of the frequency-swept light being output is completed to when the next frequency sweeping becomes possible after it has reset to the original starting frequency, the another frequency-swept light output during the time period being frequency swept at a different frequency from the frequency-swept light being output.

* * * * *